(12) United States Patent
Baars et al.

(10) Patent No.: US 8,513,083 B2
(45) Date of Patent: Aug. 20, 2013

(54) METHODS OF FORMING AN ANODE AND A CATHODE OF A SUBSTRATE DIODE BY PERFORMING ANGLED ION IMPLANTATION PROCESSES

(75) Inventors: Peter Baars, Dresden (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/218,589

(22) Filed: Aug. 26, 2011

(65) Prior Publication Data

US 2013/0049164 A1  Feb. 28, 2013

(51) Int. Cl.
*H01L 21/8222* (2006.01)

(52) U.S. Cl.
USPC .... 438/328; 438/311; 438/373; 257/E21.352; 257/E21.345

(58) Field of Classification Search
USPC ................. 438/311, 328, 373, 377, 514, 525, 438/527; 257/E21.35, E21.352, E21.345
See application file for complete search history.

(56) References Cited

U.S. PATENT DOCUMENTS

| | | | |
|---|---|---|---|
| 6,160,306 A | 12/2000 | Kim et al. | |
| 6,645,802 B1 | 11/2003 | Li et al. | |
| 7,029,965 B2 | 4/2006 | Yoshida | |
| 7,321,158 B2 | 1/2008 | Nabeshima | |
| 7,416,929 B2 | 8/2008 | Mazzola et al. | |
| 7,745,845 B2 | 6/2010 | Cai | |
| 7,943,442 B2 | 5/2011 | Gehring et al. | |
| 7,943,471 B1 | 5/2011 | Buller et al. | |
| 8,044,486 B2 | 10/2011 | Hebert | |
| 2003/0085416 A1 | 5/2003 | Brogle et al. | |
| 2009/0194839 A1 | 8/2009 | Bertin et al. | |
| 2009/0250739 A1* | 10/2009 | Johnson et al. | 257/312 |
| 2011/0177650 A1* | 7/2011 | Qian et al. | 438/75 |

* cited by examiner

*Primary Examiner* — Julia Slutsker
(74) *Attorney, Agent, or Firm* — Williams, Morgan & Amerson, P.C.

(57) ABSTRACT

Disclosed herein are various methods of forming an anode and a cathode of a substrate diode by performing angled ion implantation processes. In one example, the method includes performing a first angled ion implantation process to form a first doped region in a bulk layer of an SOI substrate for one of the anode or the diode and, after performing the first angled ion implantation process, performing a second angled ion implantation process to form a second doped region in the bulk layer of the SOI substrate for the other of the anode and the diode, wherein said first and second angled ion implantation process are performed through the same masking layer.

25 Claims, 7 Drawing Sheets

US 8,513,083 B2

METHODS OF FORMING AN ANODE AND A CATHODE OF A SUBSTRATE DIODE BY PERFORMING ANGLED ION IMPLANTATION PROCESSES

BACKGROUND OF THE INVENTION

1. Field of the Invention

Generally, the present disclosure relates to the manufacturing of sophisticated semiconductor devices, and, more specifically, to various methods of forming an anode and a cathode of a substrate diode by performing angled ion implantation processes.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit elements that substantially determine performance of the integrated circuits. A typical semiconductor chip will include millions of transistors and multiple levels of conductive interconnections to form the desired electrical circuits on the chip such that the chip may perform its intended operations.

One important issue, particularly in high performance devices, such as microprocessors and the like, is efficient management of the internal temperature of the integrated circuit device during operation. Depending upon the frequency and duration of use of an integrated circuit device, the internal temperature can rise due to the heat generated by the operation of the circuits and the transistors on the device. If the internal temperature of the chip is not monitored and maintained within acceptable limits, the operating performance of the device may be impaired or, in a worst case scenario, the integrated circuit device may be destroyed. Heat management is even more problematic for integrated circuit devices that are formed on silicon-on-insulator (SOI) substrates. An SOI substrate includes a bulk silicon substrate, a buried insulation layer (BOX) and an active layer, wherein the BOX layer is positioned between the bulk substrate and the active layer. Semiconductor devices are formed in and above the active layer. The use of the SOI substrates is beneficial for the electrical performance characteristics of devices formed on such an SOI substrate because the combination of the BOX layer (which is typically made of silicon dioxide) and surrounding trench isolation structure completely isolates the semiconductor device formed within the trench isolation structure and above the BOX layer. However, the presence of the BOX layer does reduce the heat dissipation capability of SOI devices as compared to device formed on a bulk silicon substrate. Thus, monitoring and sensing the temperature in SOI devices is of particular importance.

Typically, for thermal sensing applications, an appropriate substrate diode structure may be used wherein the electrical characteristics of the diode may be monitored to obtain regarding the thermal conditions in the vicinity of the diode structure. The sensitivity and the accuracy of the respective measurement data obtained from monitoring the substrate diode structure may depend significantly on the diode's characteristics, i.e., on the diode's current/voltage characteristic, which may depend on temperature and other parameters. In SOI devices, a corresponding substrate diode structure, i.e., the respective PN junction, is typically formed in the substrate material located below the buried insulating layer, above which is formed the "active" semiconductor layer used for forming therein the transistor elements.

FIGS. 1A-1B depict one illustrative example of a prior art substrate diode structure formed for an integrated circuit device 100. As shown therein, the substrate diode structure 101 is formed on a substrate 10 that is comprised of an active layer 10A, a buried insulation layer (BOX) 10B and a bulk silicon layer 10C. The substrate diode structure 101 generally comprises a cathode 30 and an anode 40. Also depicted in FIGS. 1A-1B is an illustrative transistor 20 comprised of a gate insulation layer 20A, a gate electrode 20B, sidewall spacers 16 and source/drain regions 22 formed in and above the active layer 10A of the substrate 10. An illustrative trench isolation structure 14 is provided to electrically isolate the transistor 20. The substrate diode structure 101 also includes an N-doped well 28 formed in the bulk silicon layer 10C, and N+ doped region 32 and a P+ doped region 42 formed within the N-doped well 28. At the point of fabrication depicted in FIGS. 1A-1B, the trenches 31, 41 have been formed for the cathode 30 and anode 40, respectively. The trenched 31, 41 extend through the active layer 10A and the BOX layer 10B. The trenches 31, 41 typically have the same configuration. In the example depicted in FIG. 1A, the trenches 31, 41 have a substantially square configuration, e.g., the dimensions 33, 43 and 45 are all about 500 nm.

A typical process flow for forming the substrate diode structure 101 will now be described. Typically, the N-doped well 28 is formed in the bulk silicon layer 10C prior to forming the trenches 31, 41 by performing a vertically-oriented ion implantation process with an N-type dopant through an implant mask (not shown), e.g., a photoresist mask, that locates the N-doped well 28 in the region of the device 100 where the cathode 30 and the anode 40 will be formed. Thereafter, the implant mask is stripped and a etch mask (not shown) is formed above the device 100 wherein the etch mask is patterned for the formation of the trenches 31, 41. One or more etching processes are then performed to form the trenched 31, 41. The etch mask is removed and first implant mask (not shown) is formed that covers the device 100 but exposes the trench 31. Then, a first vertically-oriented ion implantation process is performed with an N-type dopant to form the N+ doped region 32 within the N-doped well 28. The first implant mask is removed and a second implant mask (not shown) is formed that covers the device 100 but exposes the trench 41. Then, a second vertically-oriented ion implantation process is performed with a P-type dopant to form the P+ doped region 42 within the N-doped well 28. Thereafter, although not depicted in the drawings, metal silicide regions are formed on the N+ doped region 32 and the P+ doped region 42, and metal contacts are formed in the trenches 31, 41. In prior generation devices, the implantation processes performed to form the N+ doped region 32 and the P+ doped region 42 was part of the so-called deep source/drain implant processes performed to form the source/drain regions 22 on the transistor 20. However, in more recent generation devices, the desired dopant concentration of the N+ doped region 32 and the P+ doped region 42 is greater than can be obtained by combining such implant processes with the deep source/drain implant processes. Thus, separate ion implantation processes are typically now performed to form the N+ doped region 32 and the P+ doped region 42, as described above.

The present disclosure is directed to various novel methods of forming an anode and a cathode of a substrate diode.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming an anode and a cathode of a substrate diode by performing angled ion implantation processes. In one example, the method includes performing a first angled ion implantation process to form a first doped region in a bulk layer of an SOI substrate for one of the anode or the diode and, after performing the first angled ion implantation process, performing a second angled ion implantation process to form a second doped region in the bulk layer of the SOI substrate for the other of the anode and the diode, wherein said first and second angled ion implantation process are performed through the same masking layer.

In another illustrative example, a method disclosed herein includes forming a mask layer above an active layer of an SOI substrate and performing at least one etching process through the patterned mask layer to form a plurality of trenches that extend through the active layer and a buried insulation layer of the SOI substrate and expose a bulk silicon layer of the SOI substrate within the trenches. The method further includes performing a first angled ion implantation process through the patterned mask layer to form a first doped region in a first area of the bulk layer of the SOI substrate exposed by a first of the trenches, the first doped region being formed for one of said anode or said diode, and after performing the first angled ion implantation process, performing a second angled ion implantation process through the patterned mask layer to form a second doped region in a second area of the bulk layer of the SOI substrate exposed by a second of the trenches, the second doped region being formed for the other of the anode and the diode.

In another illustrative example, substrate diode comprising an anode and a cathode is disclosed. In this example, the device includes a first doped well positioned in a bulk layer of an SOI substrate, a first doped region positioned in the doped well, the first doped region being for one of the anode or the cathode, the first doped region having a first long axis and a second doped region positioned in the doped well, the second doped region being separate from the first doped region, the second doped region being for the other of the anode or the cathode, the second doped region having a second long axis that is oriented at an orientation angle with respect to the first long axis.

BRIEF DESCRIPTION OF THE DRAWINGS

The disclosure may be understood by reference to the following description taken in conjunction with the accompanying drawings, in which like reference numerals identify like elements, and in which.

Figure 1A:
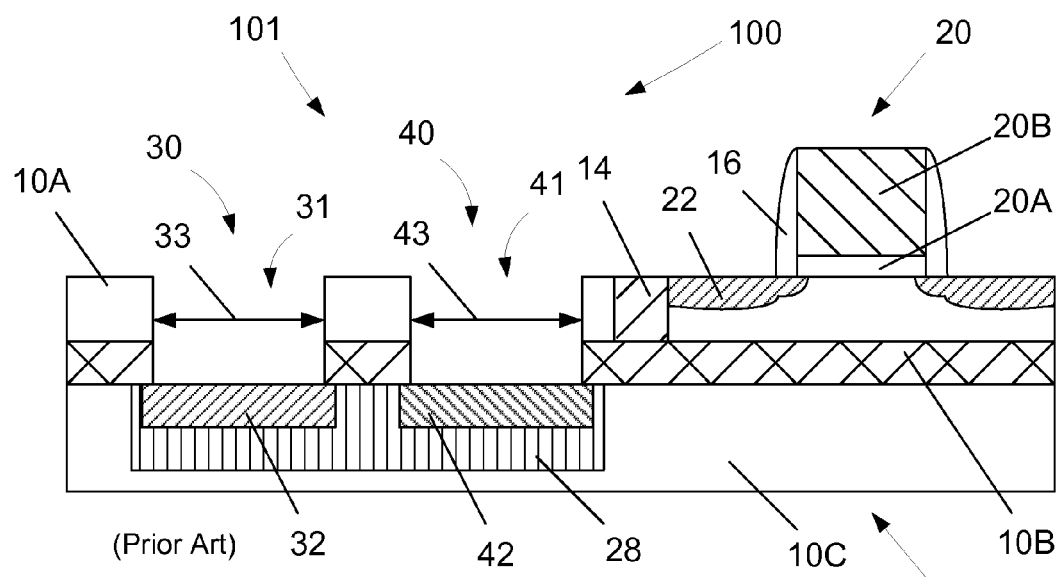
FIGS. 1A-1B depict one illustrative prior art substrate diode.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
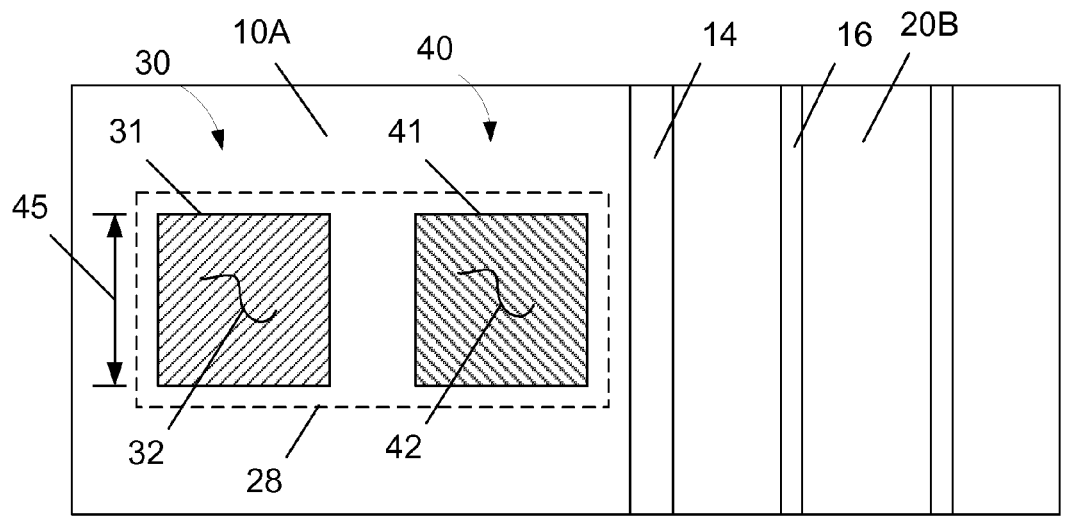

The present disclosure is directed to various methods of forming an anode and a cathode of a substrate diode by performing angled ion implantation processes. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 2A-2B and 3A-3I, various illustrative embodiments of the methods and devices disclosed herein will now be described in more detail. To the extent that FIGS. 2A-2B and 3A-3I use the same reference number as previously used on FIGS. 1A-1B, the description of those structures will apply equally to the following discussion.

Figure 2A:
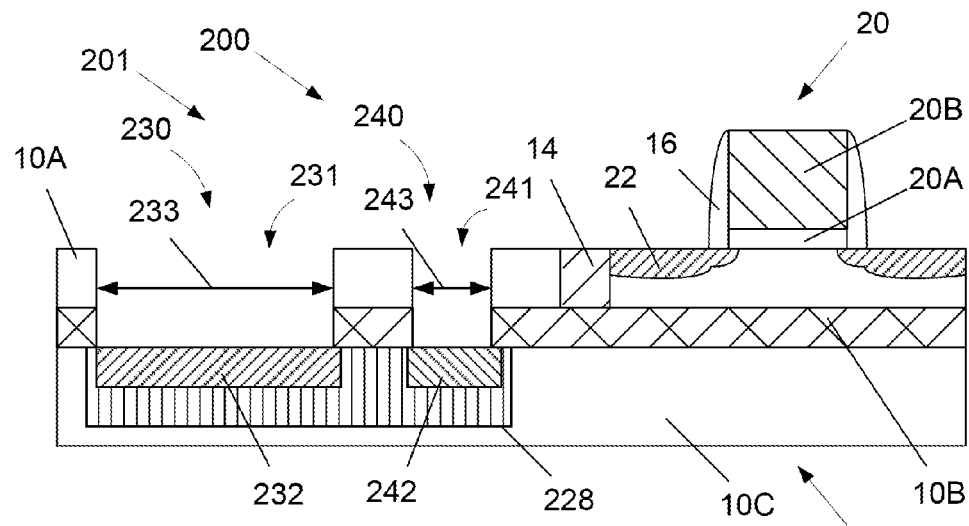
FIGS. 2A-2B, depict various one illustrative embodiment of a semiconductor device comprising a substrate diode as described herein.
Figure 2B:
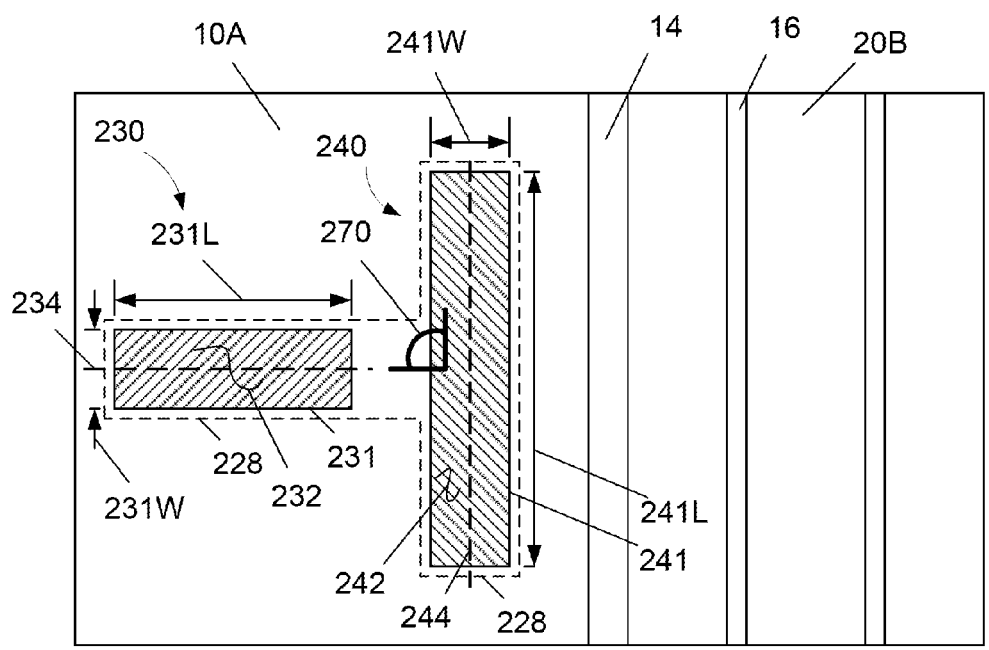

FIGS. 2A and 2B are a cross-sectional view and a plan view, respectively, of is an illustrative semiconductor device 200 at an early stage of manufacturing that is comprised of a novel substrate diode 201. The mask layer 260 (described below) is not shown in FIG. 2B to facilitate discussion. As shown therein, the substrate diode 201 is formed on a substrate 10 that is comprised of an active layer 10A, a buried insulation layer (BOX) 10B and a bulk silicon layer 10C. The substrate diode 201 generally comprises a cathode 230 and an anode 240. Also depicted in FIGS. 2A-2B is an illustrative transistor 20 comprised of a gate insulation layer 20A, a gate electrode 20B, sidewall spacers 16 and source/drain regions 22 formed in and above the active layer 10A of the substrate 10. The transistor 20 may be of any construction and it may be formed using any technique. An illustrative trench isolation structure 14 is provided to electrically isolate the transistor 20. The substrate diode 201 also includes an N-doped well 228 formed in the bulk silicon layer 10C, and N+ doped region 232 and a P+ doped region 242 formed within the N-doped well 228. At the point of fabrication depicted in FIGS. 2A-2B, trenches 231, 241 have been formed for the cathode 230 and anode 240, respectively. The trenches 231, 241 extend through the active layer 10A and the BOX layer 10B. It should be noted that the illustrative T-shaped configuration for the N-doped well 228 (see FIG. 2B) is simply an example, as the N-doped well 228 may be of any desired shape so long as it encompasses the N+ doped region 232 and the P+ doped region 242.

The trenches 231, 241 may or may not have the same dimensional characteristic or the same overall configuration. In the illustrative example depicted in FIGS. 2A-2B, the trenches 231, 241 have a substantially rectangular configuration, each having a respective long axis 234, 244, each long axis 234, 244 running in the length direction of a respective rectangular trench 231, 241 respectively. In one illustrative embodiment, the trench 231 may have a width 231W of about 250 nm and a length 231L along the direction of the long axis 234 of the trench 231 of about 500-700 nm. Similarly, in the depicted example, the trench 241 may have a width 241W of about 250 nm and a length 241L along the direction of the long axis 244 of the trench 241 of about 500-700 nm. Of course, as will be recognized by those skilled in the art after a complete reading of the present application, the dimensions of the trenches 231, 241 may vary, and the trenches 231, 241 need not have the same dimension or even the same configuration. For example, the width 231W of the trench 231 may be twice as large as the width 241W of the trench 241. Thus, the particular dimensions given as examples herein should not be considered to be a limitation of the inventions disclosed herein.

In contrast to the prior art substrate diode 101 described above with reference to FIGS. 1A-1B, the anode 230 and cathode 240 of the substrate diode 201 are configured and oriented to facilitate the fabrication of the substrate diode 201 in a more cost-efficient and quicker manner using less process steps. More specifically, the anode 230 and cathode 240 of the substrate diode 201 are configured and oriented such that their long axis 234, 244 are positioned at an angle 270 (see FIG. 2B) relative to one another. In the illustrative example depicted herein, the long axis 234, 244 are located at an angle 270 of about 90 degrees relative to one another. Of course, depending upon the application, the anode 230 and cathode 240 may be configured and oriented such that the long axis 234, 244 are located at an angle 270 ranging from about 80-100 degrees relative to one another. However, the implant angle for the angled ion implantation processes discussed below may need to be adjusted depending upon the value of the angle 270.

One illustrative method of forming the novel substrate diode 201 will now be described with reference to FIG. 3A-3I. So as not to obscure the present invention, the N-well 228 will not be shown in the plan view drawings—FIGS. 3B, 3D and 3F.

Figure 3A:
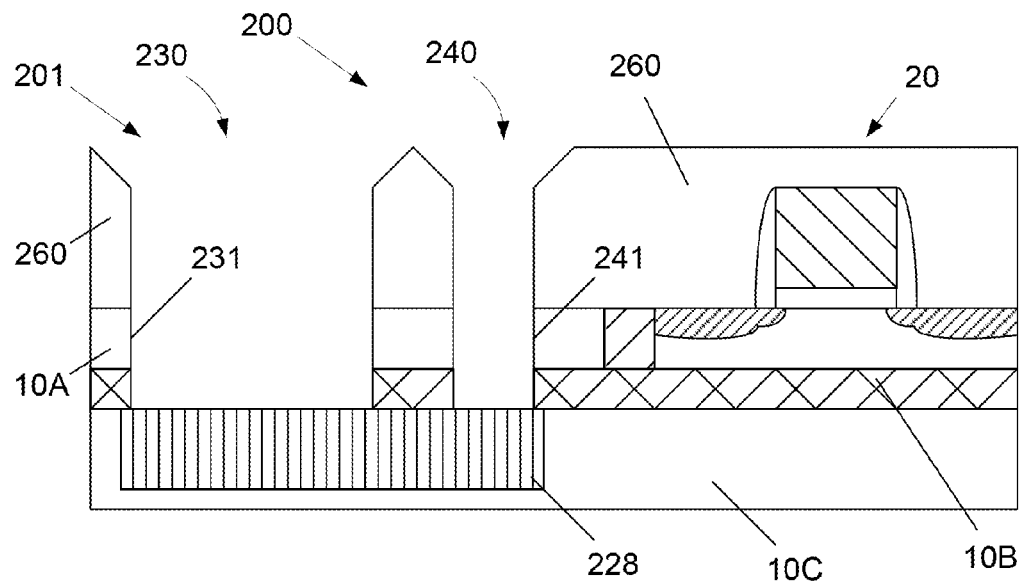
FIGS. 3A-3I depict various illustrative methods disclosed herein for forming an anode and a cathode of a substrate diode by performing angled ion implantation processes.
Figure 3B:
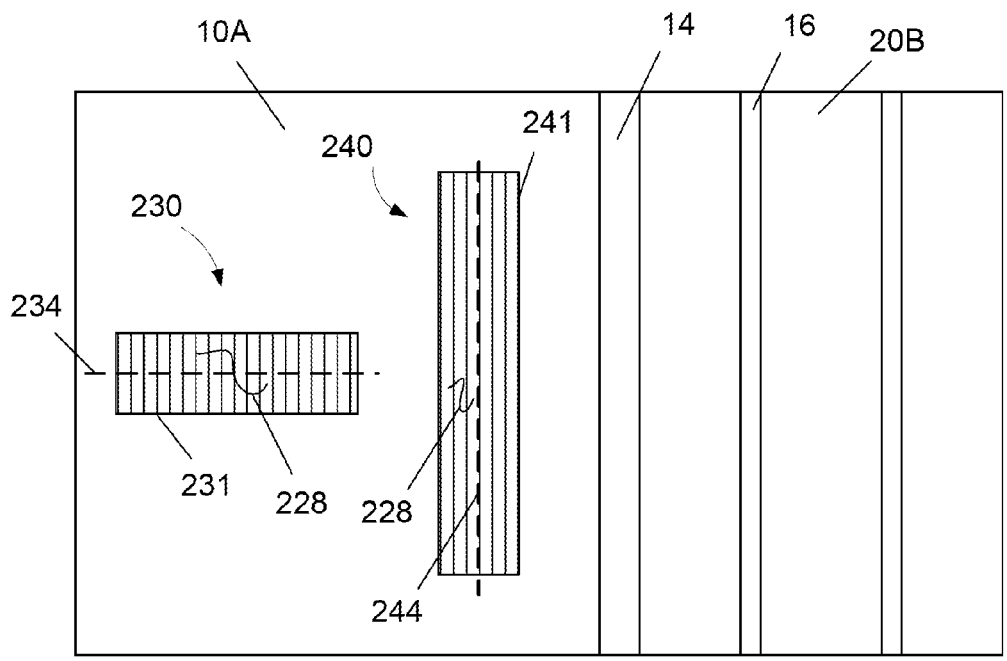

FIGS. 3A and 3B are a cross-sectional view and a plan view, respectively, of an illustrative semiconductor device 200 at an early stage of manufacturing that is comprised of a novel substrate diode 201. Cross-hatching of various doped regions shown in the various cross-sectional views of the device 200 is also carried forward to the various plan views to facilitate the disclosure of the subject matter described herein. Additionally, the mask layer 260 (described below) is not shown in FIG. 3B or other plan views of the device 200 to facilitate discussion. As shown in FIGS. 3A-3B, the N-doped well 228 is formed in the bulk silicon layer 10C prior to forming the trenches 231, 241 by performing a vertically-oriented ion implantation process with an N-type dopant, such as arsenic or phosphorus, through an implant mask (not shown), e.g., a photoresist mask that locates and configures the N-doped well 228 in the desired region of the device 200 where the cathode 230 and the anode 240 will be formed. The dose of N-type dopants used in forming the N-doped well 228 may range from approximately $5\ e^{13}\text{-}1\ e^{14}$ ion/cm$^2$ and the implant process may be performed at an energy level of approximately 240-300 keV.

Thereafter, the implant mask used to form the N-doped well 228 is stripped and a mask layer 260 is formed above the device 200 wherein the mask layer 260 is patterned for the formation of the trenches 231, 241. In one example, the mask layer 260 may be formed by depositing a layer of the masking material and thereafter forming a patterned photoresist mask above the layer of material. An etching process may then be performed through the photoresist mask to define the mask layer 260. The mask layer 260 may be comprised of a variety of materials such as carbon or an organic material, etc., and it may be formed by performing, for example, a chemical vapor deposition (CVD) process. In one example, the mask layer 260 may have a thickness ranging from 150-300 nm. One or more etching processes may then be performed through the mask layer 260 (functioning as an etch mask) to form the trenches 231, 241. The etching process performed to form the trenches 231, 241 may result in the tapering of the openings on the mask layer 260, as depicted in FIG. 3A. The formation of the trenches 231, 241 exposes the surface of the bulk silicon layer 10C within the trenches 231, 241 for further processing.

Figure 3C:
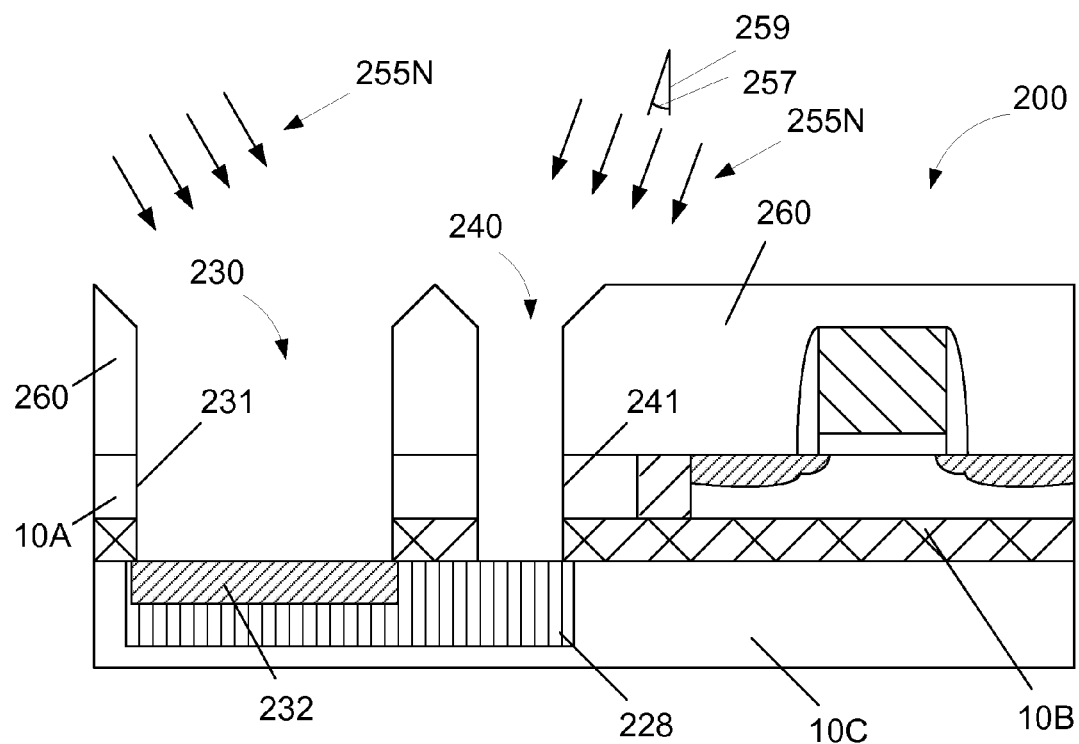
Figure 3D:
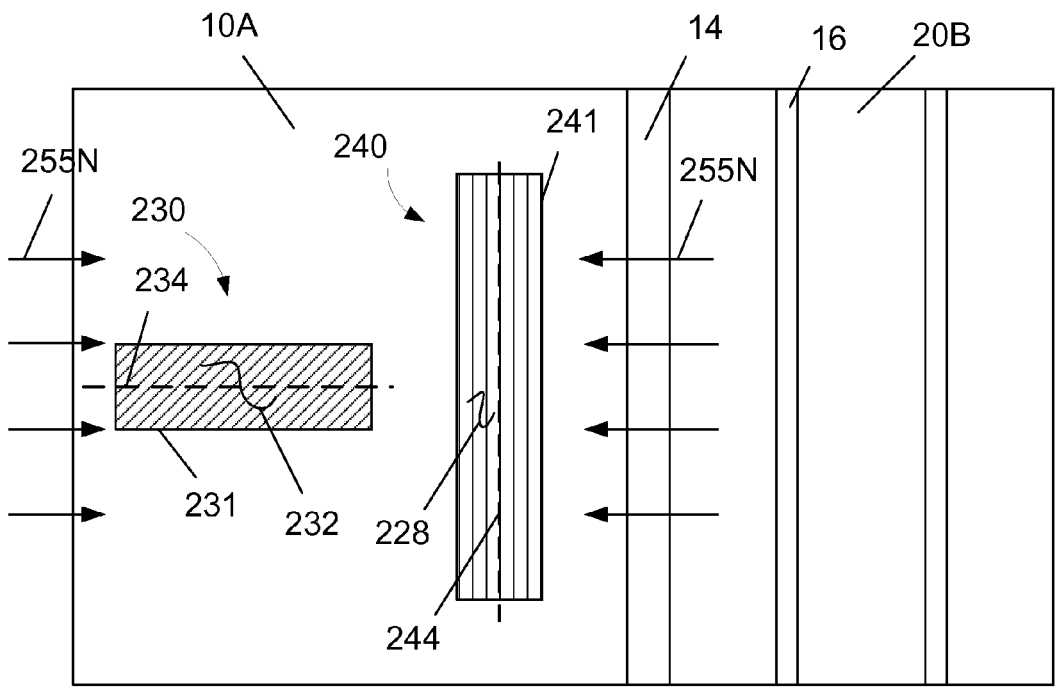

The next steps will be discussed with reference to FIGS. 3C-3D. After the formation of the trenches 231, 241, the mask layer 260, which was used as an etch mask in forming the trenches 231, 241, is left in place with both of the trenches 231, 241 open. Then, an tilted or angled (non-vertical with respect to the surface of the active layer 10A) ion implantation process 255N is performed through the mask layer 206 (now functioning as an implant mask) with an N-type dopant to form the N+ doped region 232 within the N-doped well 228. The dose of N-type dopants used during the angled ion implantation process 255N may range from approximately $2\text{-}6\ e^{15}$ ion/cm$^2$ and the implant process 255N may be performed at an energy level of approximately 12-30 keV.

The angle 257 (see FIG. 3C) relative to a vertical line 259 at which the implant process 255N is performed is selected such that ion implantation process 255N implants N-type dopants into the bulk substrate 10C exposed by the trench 231, but does not implant any appreciable amount of N-type dopants into the into the bulk substrate 10C exposed by the trench 241. This occurs due to the shielding provided by the mask layer 260 and the transverse orientation of the long axis 244 of the trench 241 relative to the long axis 234 of the trench 231. FIG. 3I is an enlarged view of a portion of the device 200 with some illustrative dimension of various structures and layers provided so as to explain one illustrative example of how the implant angle 257 for the implant process 255N may be determined. In this illustrative example, the length 231L of the trench 231 is approximately 700 nm, the width 241W of the trench 241 is approximately 250 nm, the BOX layer 10B has a thickness of about 150 nm, the active layer 10A has a thickness of about 100 nm and the mask layer 260 has relevant thickness of about 200 nm. The dashed line 256 in FIG. 3I is represents the path that ions implanted at the implant angle 257 will take. As depicted, as long as the angle 257 is equal to or greater than that depicted, ions will not be implanted into the bulk layer 10C due to the shielding effect of the mask layer 206 and the orientation of the long axis 244 of the trench 241 relative to the direction of the ion implant process 255N. In this illustrative example, long axis 244 of the trench 241 is oriented approximately 90 degrees (when viewed from above as in FIG. 3C) relative to the direction of the ion implant process 255N. In this particular example, the angle 257 (or "α") may be determined by the following mathematical formula: $\alpha = \arctan(250/450)$, which results in a value of about 30 degrees. In this illustrative example, as long as the implant angle 257 of the implant process 255N is 30 degrees or greater, little if any N-type dopant materials are implanted into the bulk substrate 10C within the area defined by the trench 241. For example, the implant process 255N may be performed at an angle 257 that ranges from about 25-60 degrees, depending upon the particular application.

Figure 3E:
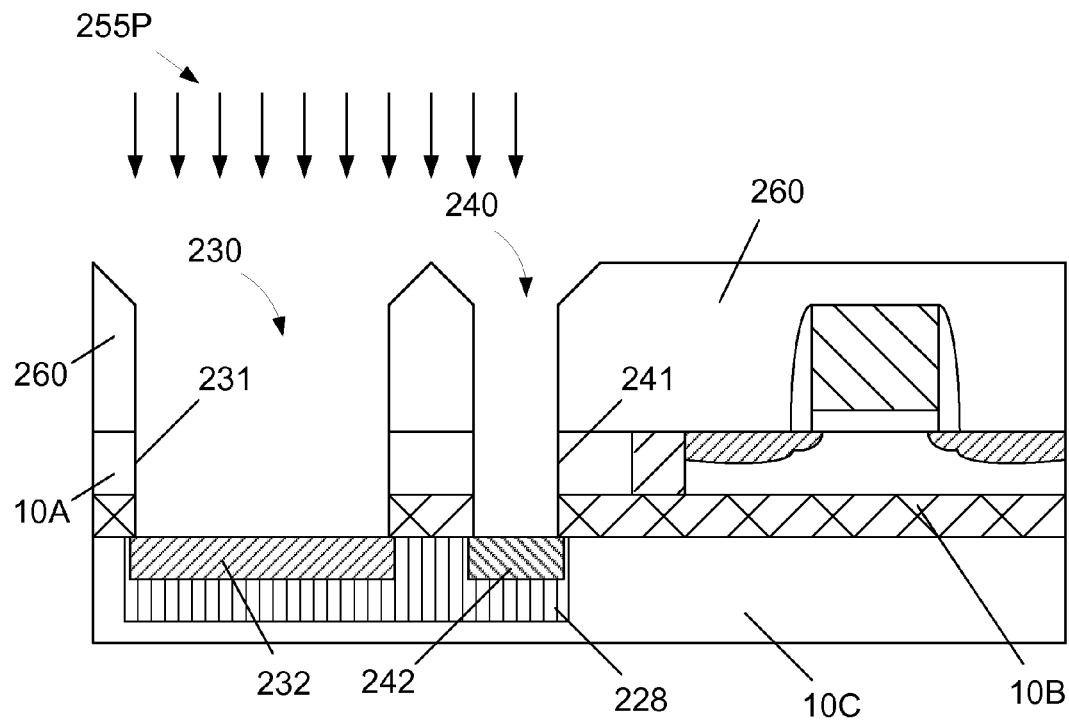
Figure 3F:
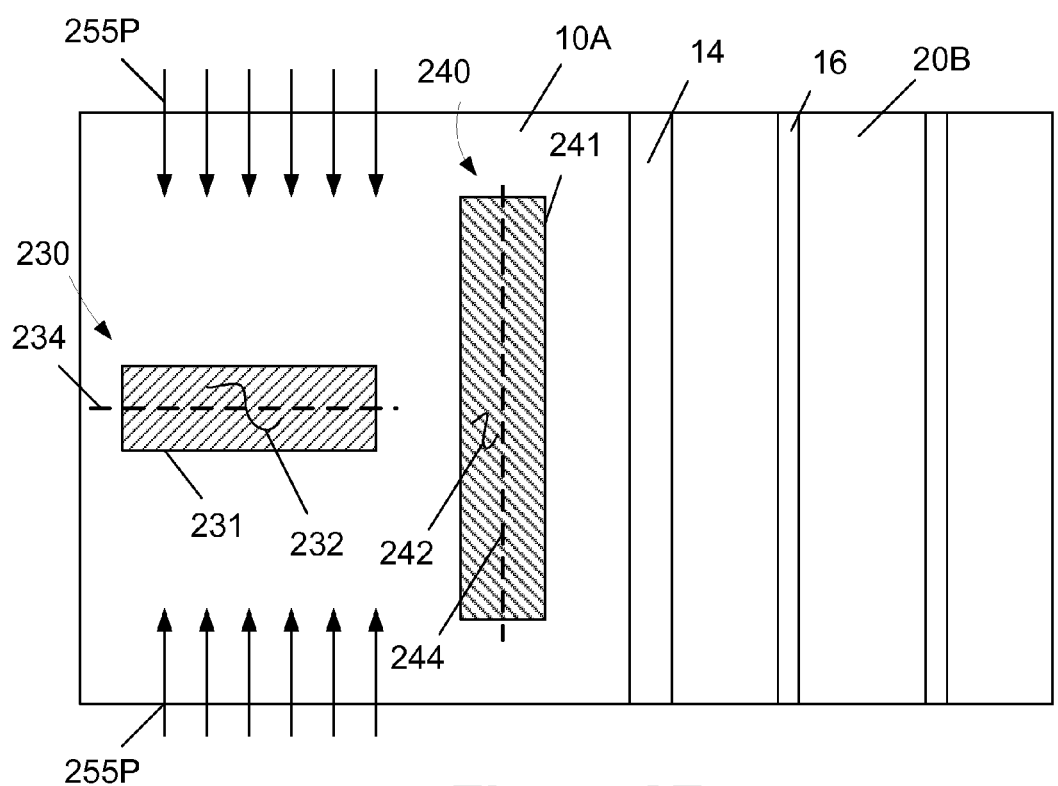

Next, as shown in FIGS. 3E-3F, with the mask layer 260 still remaining in place, and with both of the trenches 231, 241 open, the device 200 is rotated, in the depicted example it is rotated about 90 degrees, and a tilted or angled (non-vertical with respect to the surface of the active layer 10A) ion implantation process 255P is performed with a P-type dopant, such as boron, through the mask layer 206 (again functioning as an implant mask) to form the P+ doped region 242 within the N-doped well 228. The dose of P-type dopants used during the angled ion implantation process 255P may range from approximately $1-4\,e^{15}$ ion/cm$^2$ and the implant process 255P may be performed at an energy level of approximately 1-5 keV. In this illustrative example, long axis 234 of the trench 231 is oriented approximately 90 degrees (when viewed from above as in FIG. 3F) relative to the direction of the ion implant process 255P. Note that in FIG. 3E, the angle of the implant process 255P is such that the top of the arrow tilt backward relative to the drawing plane of FIG. 3E, i.e., the implant angle (α) is relative to the drawing plane. Given that, in the illustrative example depicted herein, the trenches 231, 241 have identical dimensions, the angle at which the implant process 255P may be performed without introducing P-type dopants into the bulk silicon layer 10C within the area defined by the trench 231 is same as the angle 257 for the implant process 255N—greater than 30 degrees. That is, in this example, as long as the implant angle of the implant process 255P is 30 degrees or greater, little if any P-type dopant materials are implanted into the bulk substrate 10C within the area defined by the trench 231. Of course, as noted above with respect to the implant process 255N, the implant process 255P may be performed at an angle 257 that ranges from about 25-60 degrees, depending upon the particular application.

Of course, the trenches 231, 241 may have differing dimension and configurations, and the long axis 234, 244 of the trenches 231, 241 may be oriented at an angle 270 (see FIG. 2B) other than the illustrative 90 degree angle depicted herein, such that extensions of the axis 234, 244 would intersect one another. In those situations the allowable or permissible angles for the implant processes 255N, 255P will need to be determined applying the principles described herein. Additionally, in the illustrative process flow described herein, the implant process 255N is performed prior to the implant process 255P. However, after reading the present application, those skilled in the art will readily recognize that the implant process 255P could be performed prior to the implant process 255N.

Figure 3G:
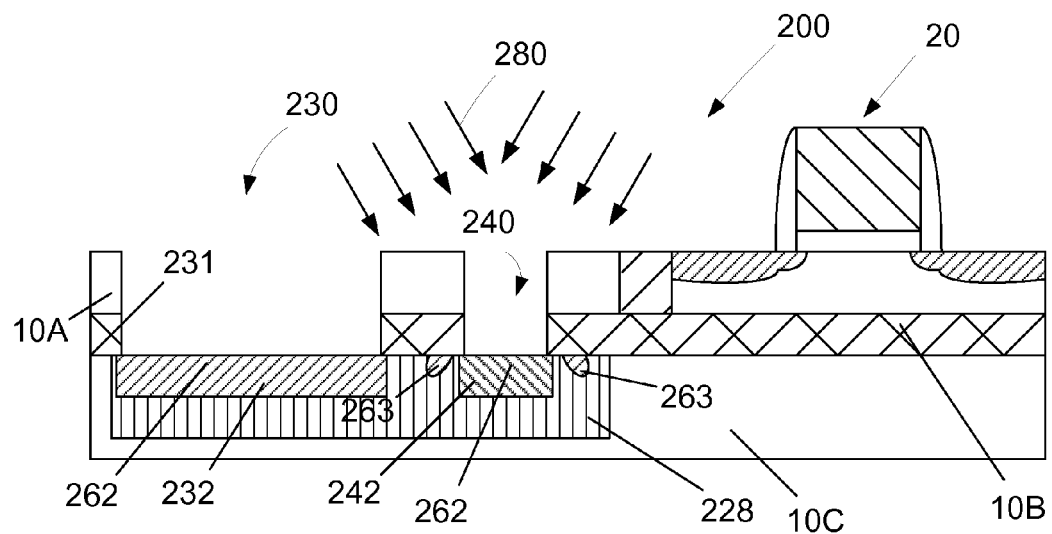

Next, as shown in FIG. 3G, in one illustrative embodiment, the mask layer 260 is removed and an angled ion implantation process 280 is performed with an N-type dopant to form the N+ doped region 263 in the N-doped well 228 on opposite sides of the P+ doped region 242. The N+ doped regions 263 act like so-called halo implants to reinforce the dopants in the N-doped well 228 and the N+ doped regions 263 tend to reduce leakage currents between the anode 230 and the cathode 240. The dose of N-type dopants used during the angled ion implantation process 280 may range from approximately $4-7\,e^{13}$ ion/cm$^2$ and the implant process 255N may be performed at an energy level of approximately 25-60 keV. The angle at which the implant process 280 is performed may range from 35-60 degrees, and the shielding effect of the active layer 10A and the BOX layer 10B will have to be accounted for in determining the permissible range of the implant angle for the implant process 280. After all of the desired dopants are implanted into the bulk substrate 10C one or more heating processes may be performed on the device 200 to activate the implanted dopants and to repair any damage to the bulk substrate 10C due to the various ion implantation processes that have been performed as described herein.

Figure 3H:
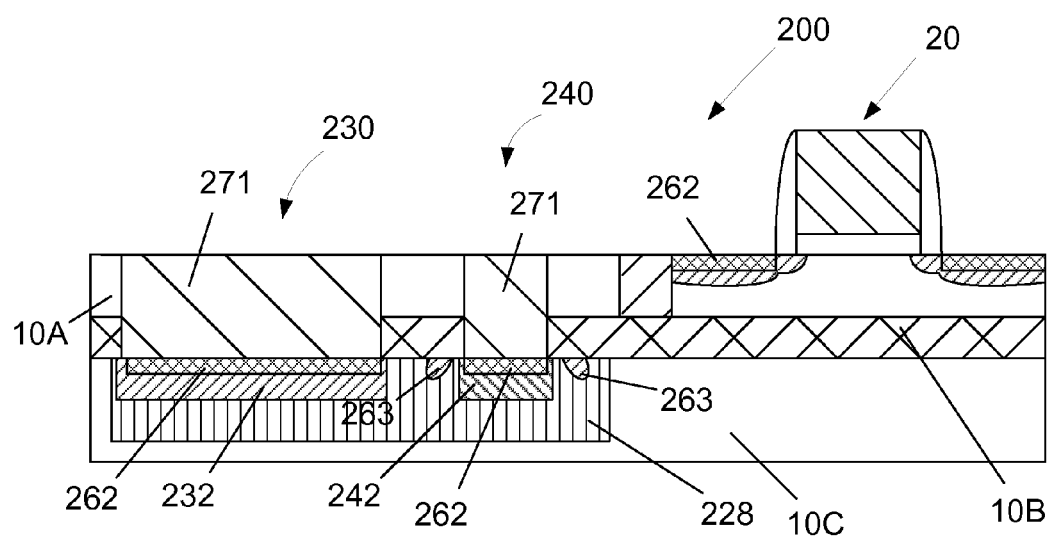
Figure 3I:
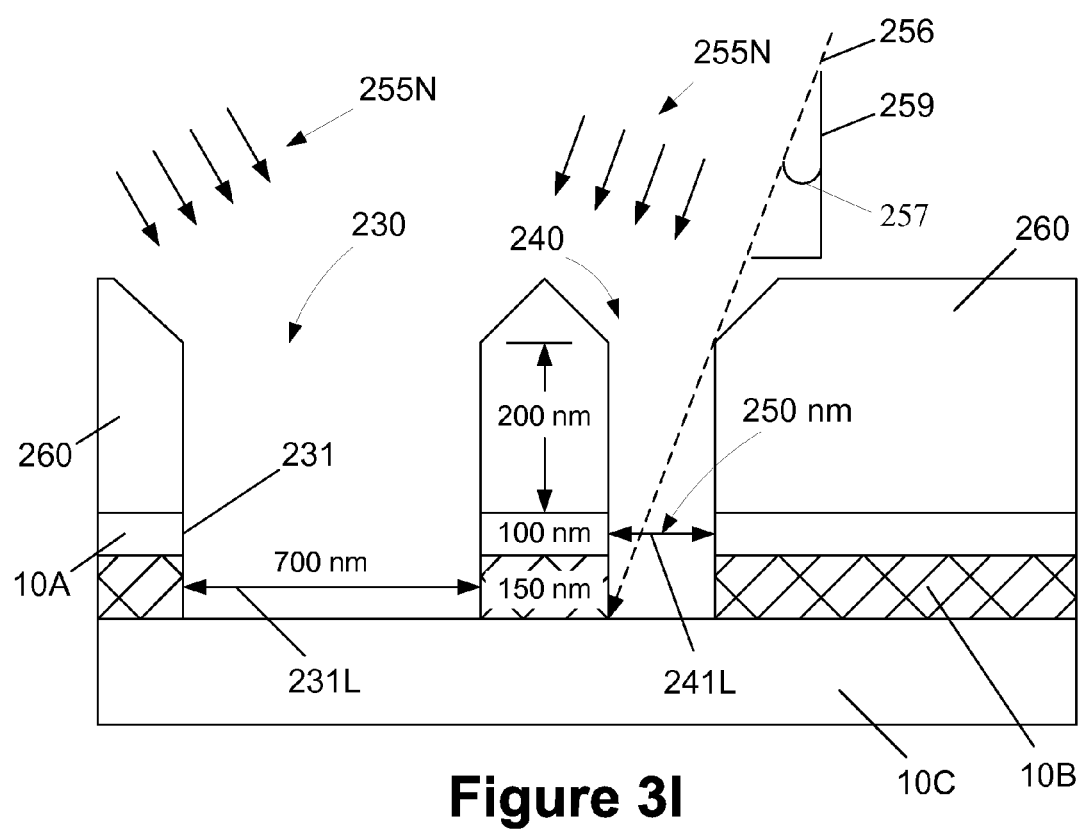

Next, as shown in FIG. 3H, metal silicide regions 262 and conductive contacts 271 are formed for the cathode 230 and the anode 240 and on the device 20 using traditional techniques and materials. The metal silicide regions 262 depicted herein may be made using a variety of different refractory metals, e.g., nickel, platinum, cobalt, etc., or combinations thereof, and they may be formed using techniques that are well known to those skilled in the art. The typical steps performed to form metal silicide regions are: (1) depositing a layer of refractory metal; (2) performing an initial heating process causing the refractory metal to react with underlying silicon containing material; (3) performing an etching process to remove unreacted portions of the layer of refractory metal and (4) performing an additional heating process to form the final phase of the metal silicide. The conductive contacts 271 may be comprised of a variety of materials, e.g., tungsten, aluminum, etc., and they may be form by depositing the material in the trenches 231, 241, for example, a physical vapor deposition (PVD) process, and thereafter performing a chemical mechanical polishing (CMP) process to remove excess portions of the conductive material positioned outside of the trenches 231, 241. Thereafter, additional processing operations to complete the device 200, such as the formation of multiple metallization layers comprised of multiple conductive contacts and lines.

The methods disclosed herein for forming the substrate diode 201 are much more efficient and cost effective than the illustrative prior art techniques described in the background section of this application for forming such structures. More specifically, by using the single mask layer 260 as an etch mask (to form the trenches 231, 241) and as an implant mask (for the implant processes 255N, 255P), the number of process operations is significantly reduced. Using the prior art techniques, separate implant masks was formed for each of the implant processes performed to form the doped regions 32, 42. As a result of using the mask layer 260, the formation and stripping of the additional implant mask used practicing the prior art techniques can be avoid, all of which reduces manufacturing time and reduces the overall cost of the resulting device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a substrate diode comprising an anode and a cathode, the method comprising:
performing a first angled ion implantation process to form a first doped region in a bulk layer below a buried insulation layer of an SOI substrate for one of said anode and said cathode of said substrate diode; and
after performing said first angled ion implantation process, performing a second angled ion implantation process to form a second doped region in said bulk layer of said SOI substrate for the other of said anode and said cathode of said substrate diode, wherein said first and second angled ion implantation process are performed through the same masking layer.

2. The method of claim 1, wherein performing said first angled ion implantation process to form said first doped region comprises performing said first angled ion implantation process with an N-type dopant to form an N-doped first doped region for said cathode.

3. The method of claim 2, wherein performing said second angled ion implantation process to form said second doped region comprises performing said second angled ion implantation process with a P-type dopant to form a P-doped second doped region for said anode.

4. The method of claim 1, wherein performing said first angled ion implantation process to form said first doped region comprises performing said first angled ion implantation process with a P-type dopant to form a P-doped first doped region for said anode.

5. The method of claim 4, wherein performing said second angled ion implantation process to form said second doped region comprises performing said second angled ion implantation process with an N-type dopant to form an N-doped second doped region for said cathode.

6. The method of claim 1, wherein performing said first angled ion implantation process to form said first doped region comprises performing said first angled ion implantation process at an implant angle of 25-60 degrees relative to a line normal to a surface of said bulk silicon layer.

7. The method of claim 1, wherein performing said second angled ion implantation process to form said second doped region comprises performing said second angled ion implantation process at an implant angle of 25-60 degrees relative to a line normal to a surface of said bulk silicon layer.

8. The method of claim 1, wherein forming said first doped region comprises forming said first doped region such that it has a substantially rectangular configuration with a first long axis running in a length direction of said substantially rectangular first doped region, and wherein forming said second doped region comprises forming said second doped region such that it has a substantially rectangular configuration with a second long axis running in a length direction of said substantially rectangular second doped region, wherein said first long axis and said second long axis are oriented at an orientation angle with respect to one another.

9. The method of claim 8, wherein said orientation angle is approximately 90 degrees.

10. The method of claim 1, further comprising forming a metal silicide region in said first and second doped regions and forming conductive contacts to said metal silicide regions.

11. The method of claim 1, wherein prior to forming said first and second doped regions, the method comprises performing a vertically oriented ion implantation process for form a doped well in said bulk layer of silicon, wherein said first and second doped regions are formed in said doped well.

12. The method of claim 1, wherein said first angled ion implantation process is performed with said SOI substrate positioned in a first orientation and said second angled implantation process is performed with said SOI substrate positioned in a second orientation that is different from said first orientation.

13. The method of claim 12, wherein said first orientation differs from said second orientation by about 90 degrees.

14. A method of forming a substrate diode comprising an anode and a cathode, the method comprising:
forming a mask layer above an active layer of an SOI substrate;
performing at least one etching process through said patterned mask layer to form a plurality of trenches that extend through said active layer and a buried insulation layer of said SOI substrate, each of said plurality of trenches exposing a bulk silicon layer of said SOI substrate below said buried insulation layer;
performing a first angled ion implantation process through said patterned mask layer to form a first doped region in a first area of said bulk layer of said SOI substrate exposed by a first of said trenches, said first doped region being formed for one of said anode and said cathode of said substrate diode;
after performing said first angled ion implantation process, performing a second angled ion implantation process through said patterned mask layer to form a second doped region in a second area of said bulk layer of said SOI substrate exposed by a second of said trenches, said second doped region being formed for the other of said anode and said cathode of said substrate diode.

15. The method of claim 14, wherein said first angled ion implantation process is performed with said substrate positioned in a first orientation, and wherein said second angled ion implantation process is performed with said SOI substrate positioned in a second orientation that is different from said first orientation.

16. The method of claim 14, wherein forming said first doped region comprises forming said first doped region such that it has a substantially rectangular configuration with a first long axis running in a length direction of said substantially rectangular first doped region, and wherein forming said second doped region comprises forming said second doped region such that it has a substantially rectangular configuration with a second long axis running in a length direction of said substantially rectangular second doped region, wherein said first long axis and said second long axis are oriented at an orientation angle with respect to one another.

17. The method of claim 16, wherein said orientation angle is approximately 90 degrees.

18. The method of claim 14, wherein forming said second doped region comprises forming said second doped region adjacent to and laterally separated from said first doped region.

19. The method of claim 14, further comprising removing said mask layer and performing a third angled ion implantation process to form a halo implantation region in said bulk silicon layer at least between said first and second doped regions.

20. The method of claim 1, wherein forming said second doped region comprises forming said second doped region adjacent to and laterally separated from said first doped region.

21. The method of claim 1, further comprising performing a third angled ion implantation process to form a halo implantation region in said bulk layer below said buried insulation layer at least between said first and second doped regions.

22. A method, comprising:
   forming a first trench through an active semiconductor layer and a buried insulation layer of an SOI substrate to expose a substantially rectangularly shaped first region of a bulk substrate layer below said buried insulation layer, said first region having a first long axis that is substantially aligned with a length direction of said first region;
   forming a second trench through said active semiconductor layer and said buried insulation layer to expose a substantially rectangularly shaped second region of said bulk substrate layer, said second region having a second long axis that is substantially aligned with a length direction of said second region, wherein said second long axis is oriented at an angle relative to said first long axis;
   performing a first angled implantation process to implant ions having a first conductivity type in said first region; and
   after performing said first angled implantation process, performing a second angled implantation process to implant a ions having a second conductivity type in said second region, wherein said first and second angled implantation process are performed in the presence of a common masking layer.

23. The method of claim 22, wherein said angle ranges from approximately 80 degrees to approximately 100 degrees.

24. The method of claim 22, wherein said first angled implantation process is performed in substantial alignment with said first long axis of said first region and said second angled implantation process is performed in substantial alignment with said second long axis of said second region.

25. The method of claim 22, wherein implanting said ions having said first conductivity type comprises forming one of an anode and a cathode of a substrate diode, and wherein implanting said ions having said second conductivity type comprises forming the other of said anode and said cathode of said substrate diode.

\* \* \* \* \*